(12) United States Patent
Chan et al.

(10) Patent No.: US 6,297,110 B1
(45) Date of Patent: Oct. 2, 2001

(54) METHOD OF FORMING A CONTACT IN AN INTEGRATED CIRCUIT

(75) Inventors: Tsiu C. Chan, Carrollton; Kuei-Wu Huang, Irving, both of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/282,730

(22) Filed: Jul. 29, 1994

(51) Int. Cl.[7] ................................ H01L 21/336
(52) U.S. Cl. .................. 438/301; 438/558; 438/586; 438/657
(58) Field of Search .................... 437/195, 228, 437/191, 193; 438/301, 558, 586, 657

(56) References Cited

U.S. PATENT DOCUMENTS

| | | | |
|---|---|---|---|
| 4,868,138 | 9/1989 | Chan et al. ................ | 437/44 |
| 4,888,297 | * 12/1989 | Aboelfotoh et al. ......... | 437/41 |
| 4,961,822 | * 10/1990 | Liao et al. ................. | 156/656 |
| 4,966,870 | * 10/1990 | Barber et al. .............. | 437/220 |
| 4,986,878 | * 1/1991 | Malazgirt et al. .......... | 156/643 |
| 4,997,790 | * 3/1991 | Woo et al. ................ | 437/195 |
| 5,022,958 | * 6/1991 | Favreau et al. ............ | 156/643 |
| 5,026,666 | * 6/1991 | Hills et al. ................ | 437/195 |
| 5,037,777 | * 8/1991 | Mele et al. ................ | 437/195 |
| 5,073,510 | * 12/1991 | Kwon et al. .............. | 437/40 |
| 5,158,910 | * 10/1992 | Cooper et al. ............. | 437/195 |
| 5,236,867 | * 8/1993 | Furuta et al. .............. | 437/189 |
| 5,268,332 | * 12/1993 | Alugbin et al. ............ | 437/228 |
| 5,270,236 | * 12/1993 | Rösner ..................... | 437/48 |
| 5,283,208 | * 2/1994 | Lorsung et al. ........... | 427/228 |
| 5,316,980 | * 5/1994 | Takeshiro ................. | 437/228 |

OTHER PUBLICATIONS

Cleeves, et al., "A Novel Disposable Post Technology for Self–Aligned Sub–Micron Contacts", 1994 Symp. on VLSI Techn. Dig. of Tech. Papers, pp. 61–62.

Ser. No. 08/362,655 Nguyen, et al. Dec. 22,1994.

Ser. No. 08/361,939 Nguyen, et al. Dec. 22, 1994.

Ser. No. 08/361,760 Chan, et al. Dec. 22, 1994.

* cited by examiner

Primary Examiner—T. N. Quach
(74) Attorney, Agent, or Firm—Theodore E. Galanthay; Lisa K. Jorgenson; Daniel E. Vanglarik

(57) ABSTRACT

A method is provided for forming an improved contact opening of a semiconductor integrated circuit, and an integrated circuit formed according to the same. Planarization of the semiconductor structure is maximized and misalignment of contact openings is tolerated by first forming a conductive structure over a portion of a first body. A thin dielectric layer is formed at least partially over the conductive structure. A thick film, having a high etch selectivity to the thin dielectric layer, is formed over the dielectric layer. The thick film is patterned and etched to form a stack substantially over the conductive structure. An insulation layer is formed over the thin dielectric layer and the stack wherein the stack has a relatively high etch selectivity to the insulation layer. The insulation layer is etched back to expose an upper surface of the stack. The stack is then etched to form an opening in the insulation layer exposing the thin dielectric layer which acts as an etch stop during the stack etch process. The thin dielectric layer is then etched in the opening to expose the first conductive layer. A conductor is then formed in the opening contacting the underlying conductive structure. The thin dielectric under the insulation layer and on the sides of the opening near the conductive structure will increase the distance and help to electrically isolate the conductor at the edge of the contact opening from nearby active areas and devices.

30 Claims, 4 Drawing Sheets

METHOD OF FORMING A CONTACT IN AN INTEGRATED CIRCUIT

FIELD OF THE INVENTION

The present invention relates generally to semiconductor integrated circuit processing, and more specifically to an improved method of forming a contact in an integrated circuit.

BACKGROUND OF THE INVENTION

As feature sizes and device sizes shrink for integrated circuits, relative alignment between interconnect layers becomes of critical importance. Misalignment can severely impact the functionality of a device. Misalignment beyond certain minimum tolerances can render a device partly or wholly inoperative.

To insure that contacts between interconnect layers are made properly even if a slight misalignment occurs during masking steps, extra space is usually included in a design around contacts and other conductive features. This extra retained space is known as enclosure and results in the well known "dogbone" structure. Enclosure sizes of up to a few tenths of a micron are typical for 0.5 to 1.0 micron feature sizes.

Enclosure requirements are not consistent with the continued shrinkage of devices. Enclosure is not related to device functionality, but is due primarily to limitations in photolithography alignment capability and is used to insure that misalignment errors do not cause problems with the device. When designing devices having minimum feature and device sizes, minimizing enclosure requirements can significantly impact the overall device size.

Self-alignment techniques are generally known in the art, and it is known that their use helps minimize enclosure requirements. However, the use of self-alignment techniques has been somewhat limited by device designs in current use.

Conventional MOS FET devices are typically comprised of a gate electrode overlying a channel region and separated therefrom by a gate oxide. Conductive regions are formed in the substrate on either side of the gate electrode and the associated channel to form the source and drain regions. However, the majority of the area required for the source and drain regions is a function of the design layout and the photolithographic steps required, for example, to align the various contact masks and the alignment tolerances.

Conventionally, an MOS transistor is fabricated by first forming the gate electrode and then the source and drain regions, followed by depositing a layer of interlevel oxide over the substrate. Contact holes are then patterned and cut through the interlevel oxide to expose the underlying source and drain regions. A separate mask is required to pattern the contact holes. This separate mask step further requires an alignment step whereby the mask is aligned with the edge of the gate electrode which is also the edge of the channel region. There is, of course, a predefined alignment tolerance which determines how far from the edge of the gate electrode will be the minimum location of the edge of the contact. For example, if the alignment tolerance were 1 micron, the contact wall on one side of the contact would be disposed one micron form the edge of the gate electrode and the other side of the contact would be one micron from the edge of the nearest structure on the opposite side thereof, such as another conductive contact or interconnection line. In this example, the alignment tolerance would result in a source and drain having a dimension of two microns plus the width of the contact. The overall width is therefore defined by alignment tolerances, the width of the conductive interconnection and the minimal separation from adjacent structures. A significant amount of surface area is thus dedicated primarily to mask alignment causing a substantial loss of real estate when designing densely packed integrated circuits.

When MOS devices are utilized in a complementary configuration such as CMOS devices, the additional space required to account for alignment tolerances becomes even more of a problem. This space requirement is due to the fact that CMOS devices inherently require a greater amount of substrate and surface area than functionally equivalent P-channel FET devices.

This size disadvantage is directly related to the amount of substrate surface area required for alignment and processing latitudes in the CMOS fabrication procedure to insure that the N- and P-channel transistors are suitably situated with respect to P-well formation. Additionally, it is necessary to isolate N- and P-channel transistors from each other with fixed oxide layers with an underlying channel stop region. As is well known, these channel stops are necessary to prevent the formation of parasitic channels or junction leakage between neighboring transistors. Typically, the channel stops are highly doped regions formed in the substrates surrounding each transistor and effectively block the formation of parasitic channels by substantially increasing the substrate surface inversion threshold voltage. Also, they are by necessity the opposite in conductivity type from the source and drain regions they are disposed adjacent to in order to prevent shorting. This, however, results in the formation of a highly doped, and therefore, low reverse breakdown voltage, P-N junction. Of course, by using conventional technology with the channel stops, there is a minimum distance by which adjacent transistors must by separated in order to prevent this parasitic channel from being formed and to provide adequate isolation.

It would be desirable to have a planar integrated circuit having contact openings that meet design rule criteria while minimizing distances between the contacts and nearby active areas and devices.

It is therefore an object of the present invention to provide a method of forming improved contact openings between active areas and devices for scaled semiconductor devices.

It is a further object of the present invention to provide minimum contact enclosure for the contacts to the active areas.

It is a further object of the present invention to provide a method of forming the contact openings whereby the junction leakage is minimized and the device integrity is maintained.

It is yet a further object of the present invention to provide a method of increasing the planarity of the surface of the wafer thereby minimizing subsequent step coverage problems.

Other objects and advantages of the present invention will be apparent to those of ordinary skill in the art having reference to the following specification together with the drawings.

SUMMARY OF THE INVENTION

The invention may be incorporated into a method for forming a contact opening of a semiconductor device structure, and the semiconductor device structure formed thereby. The process includes in a first embodiment, forming a first conductive structure over a portion of the integrated circuit. A thin dielectric, preferably an undoped oxide layer, is formed at least partially over the first conductive structure. A thick film is formed over the thin dielectric layer having a relatively high etch selectivity to the thin dielectric layer. The thick film is patterned and etched to form a stack over the first conductive structure. An insulation layer is formed over the thin dielectric layer and the stack wherein the stack has a relatively high etch selectivity to the insulation layer. The insulation layer is etched to expose an upper surface of the stack. The stack is then etched, isotropically or anisotropically, forming an opening in the insulation layer and exposing the thin dielectric layer in the opening. The thin dielectric layer is then etched in the opening exposing the underlying first conductive structure.

An alternative embodiment provides for a second conductive structure spaced a minimum distance away from the edge of the contact opening to meet design criteria and to insure proper electrical isolation. The second conductive structure is surrounded by a capping layer, preferably an oxide layer, to insure that the minimum distance between the edge of the second conductive structure and the edge of the contact in the opening is met. The thin dielectric layer and the capping layer will maintain the required distances between devices thus tolerating any misalignment of the contact openings.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
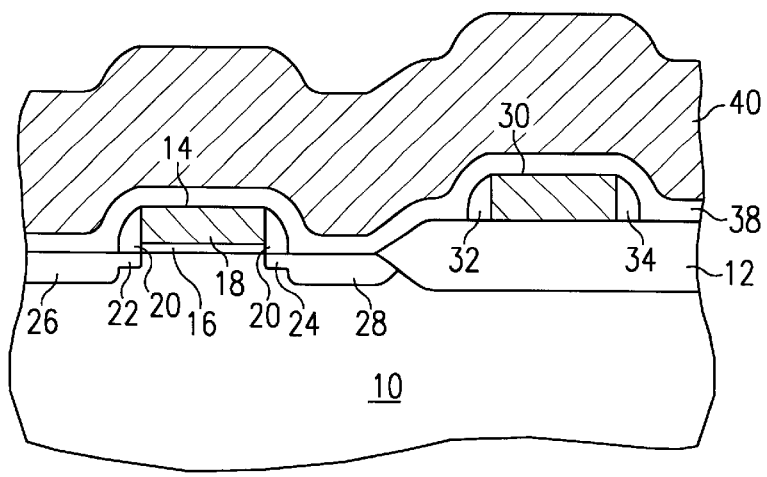
FIGS. 1–7 are cross-sectional views of the fabrication of a semiconductor integrated circuit according to one embodiment of the present invention.

Referring now to FIGS. 1–7, a preferred embodiment of the present invention will now be described in detail. FIG. 1 illustrates, in cross-section, a portion of an integrated circuit that has been partially fabricated. According to the example described herein, the present invention is directed to forming a contact opening which meets design criteria as such contacts are generally the most sensitive to the misalignment and design rules for spacing as described above. In addition, the present invention is further directed to increasing the planarity of the overall surface. FIG. 1 illustrates a portion of a wafer which has a surface at which isolation structures and devices in adjacent active areas are to be formed. As shown in FIG. 1, an integrated circuit is to be formed on a silicon substrate 10. It is contemplated, of course, that the present invention will also be applicable to the formation of other contacts, including, for example, contacts between metallization and polysilicon.

The silicon substrate may be p- or n-doped silicon depending upon the location in the wafer where the isolation and active devices are to be formed. The structure of FIG. 1 includes silicon substrate 10, into a surface of and above which is a field oxide region 12 for separating active regions or devices. Various active devices may be formed on or in the surface of the substrate as well as overlying the field oxide region 12. In a particular application, a gate electrode 14, formed from a first layer of polysilicon 18, is shown overlying a gate oxide 16. As is known in the art, typically gate electrode 14 will have sidewall oxide spacers 20, lightly doped drain regions 22, 24 and source and drain or diffused regions 26, 28. Also from the first polysilicon layer may be formed an interconnect 30 having sidewall oxide spacers 32, 24 as is known in the art. Interconnect 30 typically will at least partially overlie field oxide region 12.

The diffused or active region 28 is formed of opposite conductivity type from that of substrate 10. For example, substrate 10 may be lightly doped p-type silicon and diffusion region 28 may be heavily doped n-type silicon. Of course, as noted above, other structures (with the same or opposite conductivity type selection) may alternatively be used; for example, substrate 10 may instead be a well or tub region in a CMOS process, into which diffusion or active region 28 is formed. In the example of FIG. 1, diffusion 28 is bounded by field oxide region 12, formed in the conventional manner. In this example, diffusion 28 is relatively shallow, such as on the order of 0.15 microns, as is conventional for modern integrated circuits having sub-micron feature sizes. As such, diffusion 28 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

In the present invention, a thin conformal dielectric layer 38 is deposited over the wafer surface overlying diffusion 28, field oxide region 12 and other already formed devices such as gate electrode 14 and interconnect 30. Layer 38 may be an undoped oxide layer preferably deposited at low temperatures, for example, between 250 to 700° C. by chemical vapor deposition to a depth of about 500 to 1500 angstroms. A thick film 40 is deposited over the conformal dielectric layer 38. Thick film 40 is preferably polysilicon or other material having a relatively high etch selectivity over the underlying conformal dielectric layer 38. For purposes of illustration, thick film 40 will be referred to as polysilicon layer 40 and is preferably deposited to a thickness of about 10,000 to 15,000 angstroms.

Figure 2:
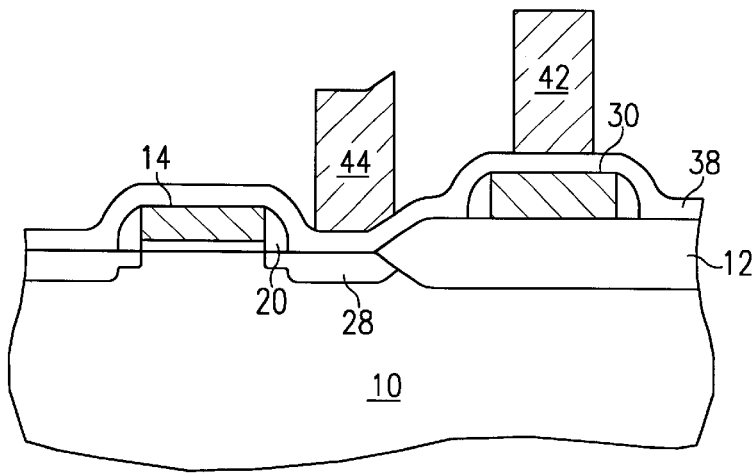

Referring now to FIG. 2, polysilicon layer 40 is patterned and etched to form polysilicon stacks 42, 44. These polysilicon stacks are formed at locations where contacts are to be made to underlying regions such as interconnect 30 and source/drain or diffused region 28.

Figure 3:
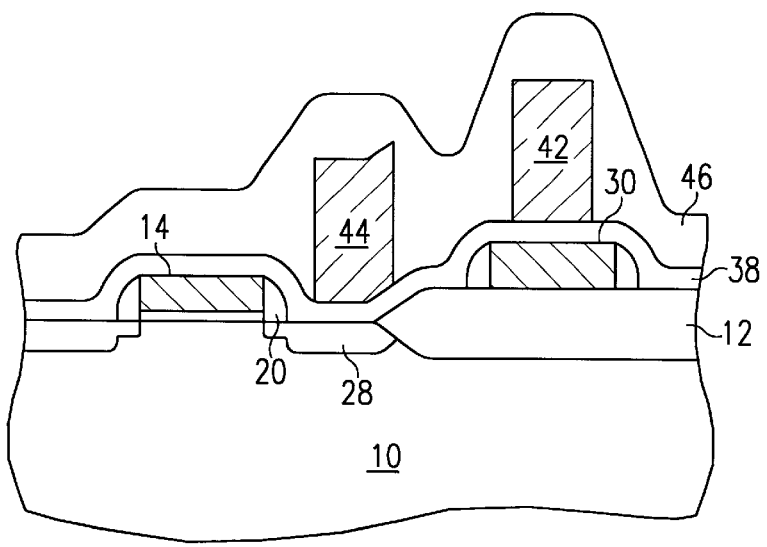

Referring to FIG. 3, dielectric layer 46 is formed over the thin conformal dielectric layer 38 and over the polysilicon stacks 42, 44. Dielectric layer 46 is preferably borophosphorous silicate glass (BPSG) or other dielectric material which has a relatively high etch selectivity to the polysilicon stacks 42, 44 as well as the conformal dielectric layer 38. Dielectric layer 46 is formed for purposes of electrically isolating overlying conductive structures from all locations except where contacts are desired therebetween, for example where the polysilicon stacks are located over such regions as diffused area 28 and interconnect 30. Dielectric layer 46 preferably has a thickness of about 10,000 to 15,000 angstroms.

Figure 4:
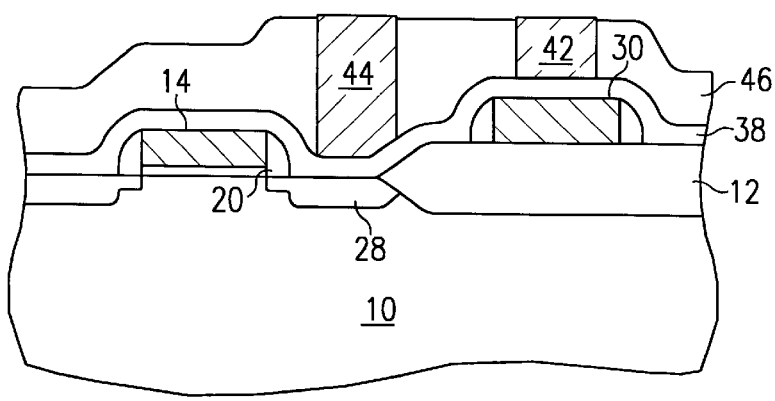

Referring to FIG. 4, dielectric layer 46 is etched to expose an upper surface of the polysilicon stacks 42, 44. If BPSG is used as dielectric layer 46, using a wet etch process with the etch rate of the BPSG over the polysilicon stacks of about 50:1 will allow an etch back of the dielectric layer 46 until the upper surface of the polysilicon stacks is reached or may allow for the BPSG layer to be etched below the upper surface of the polysilicon stacks to insure that the stacks are fully exposed. Other materials, etch ratios and etch chemistries may be used to achieve a similar result, for example, chemical/mechanical polishing of dielectric layer 46 may result in a relatively planar etch back exposing the upper surface of the polysilicon stacks 42, 44. An additional alternative may be to form a composite dielectric layer 46 by forming spin-on-glass over the BPSG and partially etching the spin-on-glass and BPSG at a 1:1 etch ratio until the upper surfaces of the polysilicon stacks are exposed. Various etch back techniques known in the art such as those described above will accomplish the desired result of partially planarizing the structure and exposing the upper surface of the stacks.

Figure 5:
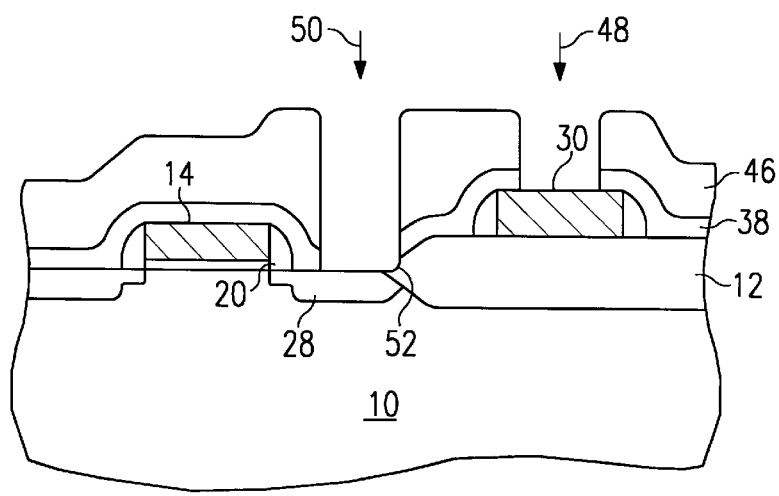

Referring to FIG. 5, the polysilicon stacks 42, 44 are selectively etched by isotropic or anisotropic etching. The etch chemistry used will etch the polysilicon or other material used for the stacks at a high etch rate over the etch rate for the dielectric layer 46. Contact openings 48 and 50 will thus be formed through the dielectric layer 46 where the polysilicon stacks were formed, in this example, over diffused region 28 and interconnect 30. The thin conformal dielectric layer 38 acts as an etch stop during the polysilicon stack etch step to prevent the underlying active areas and devices from being etched away. In addition, conformal dielectric layer 38 helps to maintain the distance between the edge of the contact opening and the neighboring devices, thus maintaining required distances between devices and insuring device integrity as will be more fully described below with reference to an alternative embodiment.

The thin conformal dielectric layer 38 is next etched from the contact openings 48, 50 exposing the active regions or devices in the contact openings. The conformal dielectric layer 38 is preferably removed by anisotropic etching to maintain the vertical dimensions or width of the contact opening. In addition to the etch back of the dielectric layer 46, the dielectric or BPSG may be reflowed before or after etching the polysilicon stacks to increase the planarity of the dielectric layer.

Figure 6:
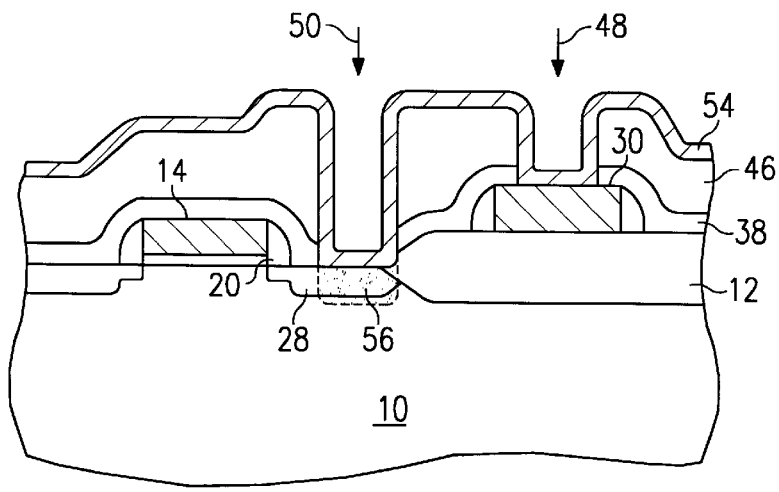

Referring to FIG. 6, the polysilicon stacks were preferably patterned to have a width smaller than the width of the underlying active devices or regions, in this example, having a width of about 4000 angstroms. Thus, some misalignment of the polysilicon stacks over the active areas and devices can be tolerated. In the present example, opening 50 is shown as misaligned over diffused region 28 toward the field oxide region 12. If this misalignment occurs over this active area, a portion of the field oxide region 12 at location 52 may be removed when the conformal dielectric layer 38 is removed from the contact opening 50 possibly reducing the area of contact between an overlying conductor and source/drain region 28. In addition, encroaching into the field oxide may also increase potential junction leakage problems. The stack may also be misaligned over the interconnect whereby it opens over one of the sidewall oxide spacers or it may open over the interconnect line and both sidewall oxide spacers. In order to offset these problems, a thin layer of polysilicon 54 may be deposited on the dielectric layer 46 and in the openings 48 and 50. Polysilicon layer 54 is preferably deposited to a thickness which will permit filling the openings later with a conductive material to form an interconnect to the underlying active areas or devices, for example, if the opening is approximately 4000 angstroms, polysilicon layer 50 may be deposited to a thickness of about 1000 angstroms. Polysilicon layer 54 may then be doped to help prevent junction leakage if a misalignment occurs. Polysilicon layer 54 is doped with a similar dopant as the diffused region 24, such as by ion implantation or other suitable method. For example, if the source/drain region 28 has previously been doped with an N+ dopant such as arsenic, then polysilicon layer 54 may be doped with an N+ dopant such as phosphorous. As the polysilicon layer 54 is doped, dopants will diffuse into the substrate to some predetermined depth 56 based upon the dopant concentration and energy level. Doped region 56 will help to heal the junction region and prevent junction leakage.

Figure 7:
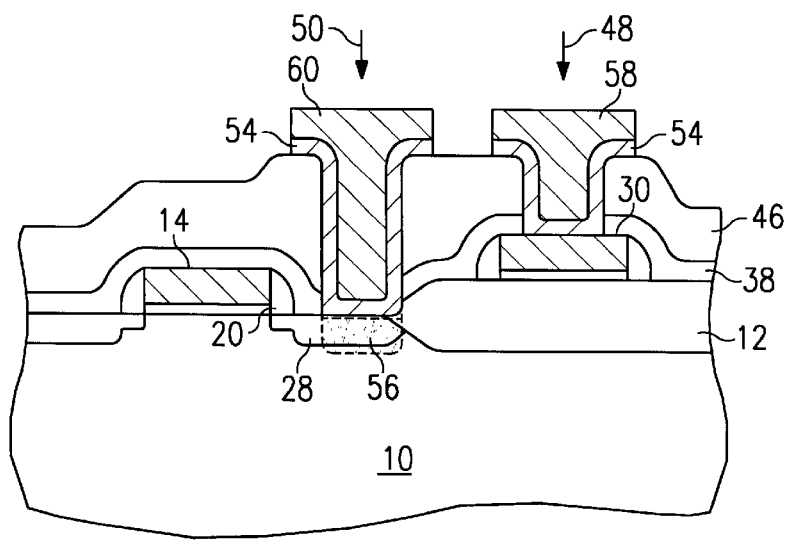

Referring to FIG. 7, a conductive layer is formed over the polysilicon layer 54, patterned and etched as known in the art to form conductive contacts 58, 60 to the active areas and devices. Polysilicon layer 54 will typically be patterned and etched at the same time as the conductive contacts. Contacts 58, 60 may typically be aluminum, tungsten or other suitable contact material. The present invention provides for a contact opening which tolerates misalignment or oversized contact openings and insures device integrity by healing junction exposures. In addition, the thick film and polysilicon stacks provide for a more planar structure.

Figure 8:
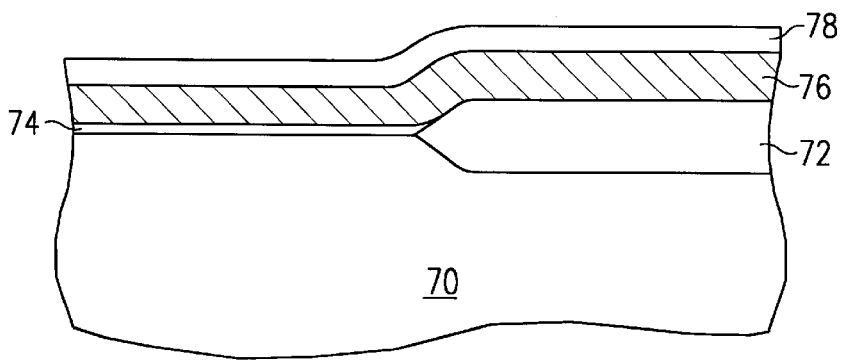
FIGS. 8–12 are cross-sectional views of the fabrication of a semiconductor integrated circuit according to an alternative embodiment of the present invention.

Referring now to FIGS. 8–12, an alternative embodiment of the present invention will now be described in detail. FIG. 8 illustrates, in cross-section, a portion of an integrated circuit that has been partially fabricated. According to the example described herein, the alternative embodiment of the present invention is also directed to forming a contact opening which meets design criteria but which is further capable of tolerating the sensitive misalignment problems and design rules for spacing as described above. FIG. 8 illustrates a portion of a wafer which has a surface at which isolation structures and devices in adjacent active areas are to be formed. As shown in FIG. 8, an integrated circuit is to be formed on a silicon substrate 70. It is again contemplated that the alternative embodiment will also be applicable to the formation of other contacts.

As described above with reference to the preferred embodiment, the silicon substrate may be p- or n-doped silicon depending upon the location in the wafer where the isolation and active devices are to be formed. The structure of FIG. 8, includes silicon substrate 70, into a surface of and above which is a field oxide region 72 for separating active regions or devices. Various active devices may be formed on or in the surface of the substrate as well as overlying the field oxide region 12. In a particular application, a gate oxide layer 74 is formed over the substrate and field oxide region. A doped polysilicon or polycide layer 76 is formed over the gate oxide layer as is known in the art. An undoped dielectric layer 78 such as oxide is formed over the polysilicon layer 76.

Figure 9:
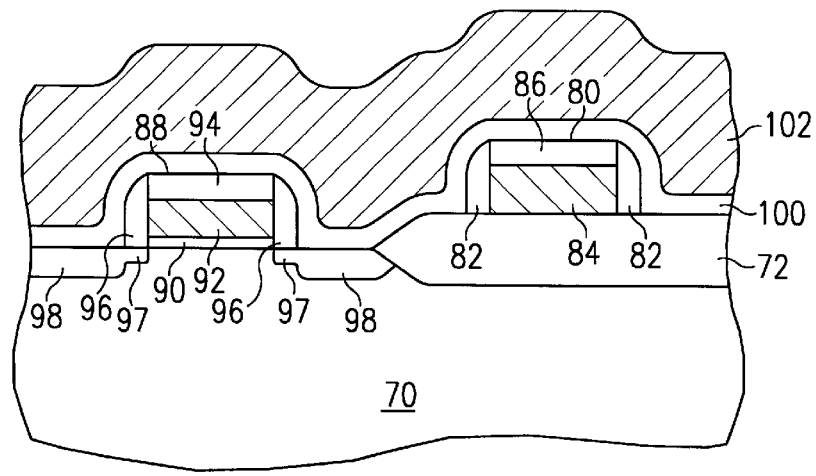

Referring to FIG. 9, these three layers 74, 76, 78 are patterned and etched to form interconnect 80 and gate electrode 88 as is known in the art. As is described above, typically gate electrode 88 will have gate oxide 90, doped polysilicon layer 92, sidewall oxide spacers 96, lightly doped drain regions 97 and source and drain or diffused regions 98. In addition, in this example, gate electrode 88 will also have a capping layer 94 formed from the undoped oxide layer 78. Also from the first polysilicon layer may be formed interconnect 80 having a doped polysilicon layer 82 and sidewall oxide spacers 84 as is known in the art. Also, in this embodiment is shown a capping layer 86 formed from the undoped oxide layer 78. Interconnect 80 typically will at least partially overlie field oxide region 72. Capping layers 86, 94 will preferably have a thickness of about 1500 to 2000 angstroms.

Similar processing steps will now be shown as described above with reference to the preferred embodiment. A thin conformal dielectric layer 100 is deposited over the wafer surface overlying diffusion region 98, field oxide region 72 and other already formed devices such as gate electrode 88 and interconnect 80. Conformal dielectric layer 100 is preferably an oxide layer deposited to a thickness of about 500 to 1500 angstroms. It is important, as will be discussed in detail below, that conformal dielectric layer 100 have a thickness less than the thickness of the capping layers 86, 94. A thick film 102 is deposited over the conformal dielectric layer 100. Thick film 102 is again preferably polysilicon or other material having a relatively high etch selectivity over the underlying conformal dielectric layer 100 and is preferably deposited to a thickness of about 10,000 to 15,000 angstroms.

Figure 10:
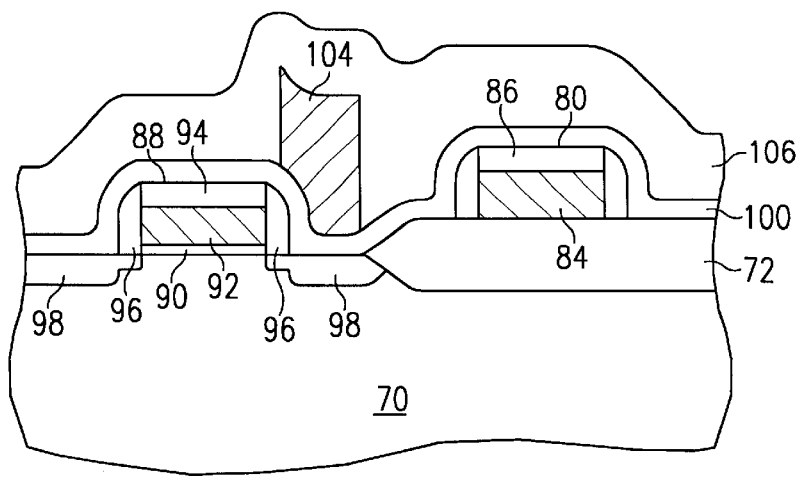

Referring now to FIG. 10, for ease of illustration of the alternative embodiment, only a contact to the source/drain or diffused region 98 will be illustrated. Contacts to other active regions or devices, is of course, contemplated. Polysilicon layer 102 is patterned and etched to form a polysilicon stack 104. Dielectric layer 106 is formed over the thin conformal dielectric layer 100 and over the polysilicon stack 104. As described above, dielectric layer 106 is preferably borophosphorous silicate glass (BPSG) or other dielectric material which has a relatively high etch selectivity to the polysilicon stack 104 as well as the conformal dielectric layer 100. Dielectric layer 106 will electrically isolate the overlying conductive structures from all locations except where contacts are desired therebetween.

Figure 11:
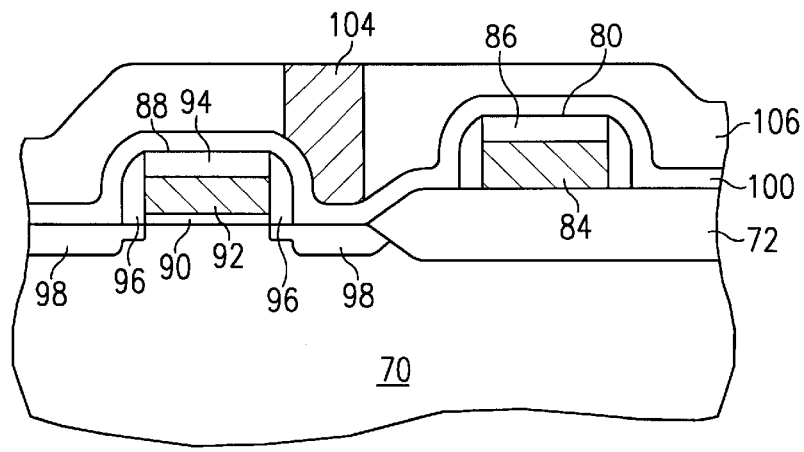

Referring to FIG. 11, dielectric layer 106 is etched to expose an upper surface of the polysilicon stack 104. Various etch back techniques known in the art such as those described above will accomplish the desired result.

Figure 12:
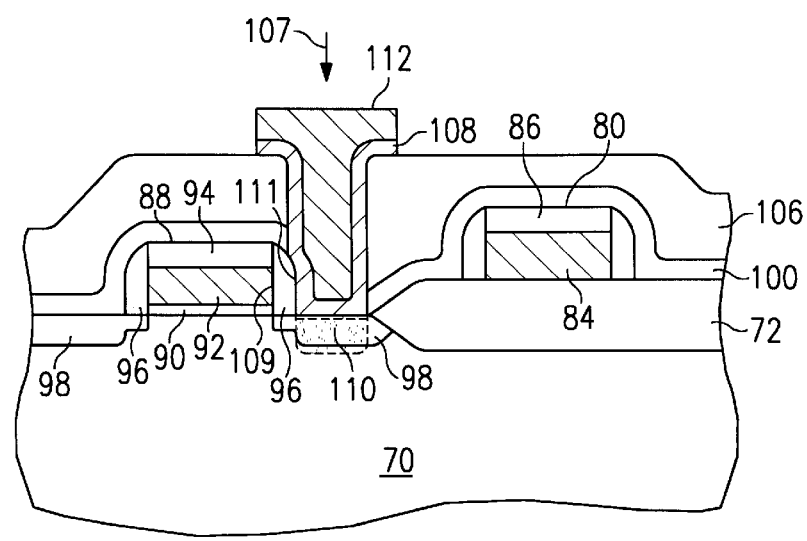

Referring to FIG. 12, the polysilicon stack 104 is etched by isotropic or anisotropic etching forming a contact opening 107 through the dielectric layer 106. Polysilicon stack, in this example, is shown misaligned in the opposite direction over the source/drain region 98 and is partially aligned over the gate electrode 88. The thin conformal dielectric layer 100 is also etched from the contact opening 107 exposing the active area 98 in the contact opening. The conformal dielectric layer 100 is preferably removed by anisotropic etching to maintain the vertical dimensions or width of the contact opening. If misalignment of the gate electrode occurs in one direction and the contact opening is misaligned in the opposite direction, a cumulative error results. This error must be accounted for by providing additional space between the edge of the gate electrode and the edge of the active area. If misalignment occurs, a portion of the capping layer 94 or sidewall oxide spacer 96 may be removed at the same time that the conformal dielectric layer 100 is etched in the opening 107.

In this example, any misalignment of the contact opening 107 may decrease the contact space between the edge 109 of gate electrode 88 and the edge 111 of the contact opening 107. Due to the misalignment of the contact opening, in this example, effectively opening over the sidewall spacer 96, the distance between these active areas may be reduced enough such that the design rules for a metal contact space to gate cannot be tolerated to insure device integrity. Thus, the thickness of the capping layer 94 will insure that the required distance between the devices in order to maintain device integrity will be met. However, the thickness of the capping layer 94 must be greater than the thickness of the conformal dielectric layer 100 and thick enough that if the conformal dielectric layer 100 is overetched there will still remain enough capping layer to insure that design rules are met. In this example, the capping layer is about 1500 to 2000 angstroms while the conformal dielectric layer is about 1000 to 1500 angstroms.

As in the preferred embodiment, a polysilicon layer 108 may then be deposited to a thickness of about 1000 angstroms on the dielectric layer 106 and in the opening 107. Polysilicon layer 108 may then be doped to help prevent junction leakage. As the polysilicon layer 108 is doped, dopants will diffuse into the substrate to some predetermined depth 110. Doped region 110 will heal the junction region and prevent junction leakage. A conductive layer is then formed over the polysilicon layer 108, patterned and etched along with polysilicon layer 108 as known in the art to form a conductive contact 112 to the active area 98.

By adding the capping layer, opening the contact becomes a self-aligned feature such that the contact opening is now self-aligned to the gate. This self-aligned process can eliminate the conventional "dogbone" structure or larger enclosure needed, thereby increasing the density of devices on the integrated circuit. This process can also be used for other layers to eliminate the "dogbone" features and minimize the required design rules. As described above, in addition to the self-aligned benefit of the present invention, a more planar structure with high integrity junctions are achievable.

Although the preferred embodiment has been described in detail, it should be understood that various changes, substitutions and alterations can be made therein without departing from the spirit and scope of the invention as defined by the appended claims.

What is claimed is:

1. A method of forming a contact opening, comprising the steps of:

forming a first conductive structure in a substrate adjacent a field oxide region;

forming a dielectric layer over the first conductive structure;

forming a film having a high etch selectivity to the dielectric layer for a given etchant;

patterning and etching the film to form a stack at least partially over the first conductive structure;

forming an insulation layer over the dielectric layer and stack wherein the stack has a high etch selectivity to the insulation layer for a given etchant;

etching the insulation layer to expose an upper surface of the stack;

etching the stack to form an opening in the insulation layer exposing the dielectric layer in the opening;

etching the exposed dielectric layer in the opening exposing the underlying first conductive structure;

forming a conformal polysilicon layer over the insulation layer and in a portion of the opening overlying the first conductive structure;

doping the conformal polysilicon layer, wherein doping the conformal polysilicon layer further dopes a region underlying the conformal polysilicon layer in the substrate and adjacent the field oxide region; and forming a conductor over the conformal polysilicon layer.

2. The method of claim 1, wherein the dielectric layer comprises an undoped oxide.

3. The method of claim 2, wherein the undoped oxide layer is deposited to a thickness of about 1000 to 1500 angstroms.

4. The method of claim 1, wherein the film comprises polysilicon.

5. The method of claim 1, wherein the film is deposited to a thickness of about 10,000 to 15,000 angstroms.

6. The method of claim 1, wherein the insulation layer comprises borophosphorous silicate glass (BPSG).

7. The method of claim 1, wherein the stack over the first conductive structure is patterned having a width of about 4000 angstroms.

8. The method of claim 1, further comprising the step of:

reflowing the insulation layer before etching the insulation layer.

9. The method of claim 1, further comprising the step of:

reflowing the insulation layer after etching the insulation layer which exposes the upper surface of the stack.

10. The method of claim 1, further comprising the step of:

reflowing the insulation layer after the stack is etched away which exposes the dielectric layer in the opening.

11. The method of claim 1, wherein etching the stack comprises an isotropic etching step.

12. The method of claim 1, wherein etching the stack comprises an anisotropic etching step.

13. The method of claim 1, wherein etching the stack comprises chemical/mechanical polishing.

14. The method of claim 1, wherein etching the dielectric layer comprises an anisotropic etching step.

15. The method of claim 1, wherein etching the stack further comprises the steps of:

forming spin-on-glass over the insulation layer before etching; and etching the spin-on-glass and insulation layer at an approximately 1:1 etch ratio until the upper surface of the stack is exposed.

16. The method of claim 1, wherein the first conductive structure is a source/drain region.

17. The method of claim 16, wherein a portion of the field oxide region adjacent the source/drain region and in the opening is etched when the dielectric layer is etched in the opening.

18. The method of claim 1, further comprising the step of:

forming a conductive contact in the opening and over the insulation layer.

19. The method of claim 1, wherein the conformal polysilicon layer is deposited to a thickness of about 1000 angstroms.

20. The method of claim 1, wherein the opening has a smaller width than the width of the underlying first conductive structure.

21. The method of claim 1, wherein the step of doping the conformal polysilicon layer heals the underlying substrate and prevents junction leakage.

22. A method of forming a self-aligned contact opening, comprising the steps of:

forming a first conductive structure over a substrate having an insulating capping layer surrounding the first conductive structure;

forming a second conductive structure in the substrate adjacent the first conductive structure and a field oxide region;

forming a dielectric layer over the first and second conductive structures wherein the dielectric layer has a thickness less than the thickness of the capping layer;

forming a film having a high etch selectivity to the dielectric layer;

patterning and etching the film to form a stack at least partially over the second conductive structure;

forming an insulation layer over the dielectric layer and stack wherein the stack has a high etch selectivity to the insulation layer;

etching the insulation layer to expose an upper surface of the stack;

etching the stack to form an opening in the insulation layer exposing the dielectric layer in the opening;

etching the exposed dielectric layer in the opening exposing the underlying second conductive structure wherein a portion of the capping layer remains on the first conductive structure;

forming a conformal polysilicon layer over the insulation layer and in a portion of the opening overlying the second conductive structure;

doping the conformal polysilicon layer, wherein doping the conformal polysilicon layer further dopes a region underlying the conformal polysilicon layer in the substrate and adjacent the field oxide region; and forming a conductor over the conformal polysilicon layer; and forming a conductive contact in the opening electrically contacting the second conductive structure wherein the first conductive structure is electrically isolated by the capping layer from the conductive contact in the opening.

23. The method of claim 22, wherein forming the first conductive structure further comprises the steps of:

forming a gate oxide layer over the substrate;

forming a doped polysilicon layer over the gate oxide layer;

forming the capping layer over the doped polysilicon layer; and patterning and etching the capping layer, doped polysilicon layer and gate oxide layer to form a gate electrode.

24. The method of claim 22, wherein the capping layer is a first undoped oxide layer formed to a thickness of about 1500 to 2000 angstroms.

25. The method of claim 22, wherein the second conductive structure is a source/drain region.

26. The method of claim 22, wherein the dielectric layer is an undoped oxide layer deposited to a thickness of about 1000 to 1500 angstroms.

27. The method of claim 22, further comprising the step of:

forming a conductive contact in the opening and over the insulation layer.

28. The method of claim 22, wherein the conformal polysilicon layer is deposited to a thickness of about 1000 angstroms.

29. The method of claim 22, wherein the opening has a smaller width than the width of the underlying second conductive structure.

30. The method of claim 22, wherein the step of doping the conformal polysilicon layer heals the underlying substrate and prevents junction leakage.

* * * * *